(12) United States Patent
Horak et al.

(10) Patent No.: US 8,558,284 B2
(45) Date of Patent: Oct. 15, 2013

(54) INTEGRATED CIRCUIT LINE WITH ELECTROMIGRATION BARRIERS

(75) Inventors: David V. Horak, Essex Junction, VT (US); Takeshi Nogami, Albany, NY (US); Shom Ponoth, Hopewell Junction, NY (US); Chih-Chao Yang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/424,651

(22) Filed: Mar. 20, 2012

(65) Prior Publication Data

US 2012/0175775 A1 Jul. 12, 2012

Related U.S. Application Data

(62) Division of application No. 12/652,485, filed on Jan. 5, 2010, now Pat. No. 8,211,776.

(51) Int. Cl.
*H01L 27/10* (2006.01)

(52) U.S. Cl.
USPC ............ 257/211; 257/758; 257/E23.145

(58) Field of Classification Search
USPC .......... 257/211, 758, 759, 760, 762, 767, 257/E23.145
See application file for complete search history.

(56) References Cited

U.S. PATENT DOCUMENTS

| | | | |
|---|---|---|---|
| 4,962,060 A | 10/1990 | Sliwa et al. | |
| 5,410,490 A | 4/1995 | Yastrow | |
| 5,439,731 A | 8/1995 | Li et al. | |
| 5,470,788 A | 11/1995 | Biery et al. | |
| 5,737,580 A | 4/1998 | Hathaway et al. | |
| 5,899,707 A * | 5/1999 | Sanchez et al. | 438/131 |
| 6,245,996 B1 | 6/2001 | Atakov et al. | |
| 6,251,528 B1 | 6/2001 | Uzoh et al. | |
| 6,489,684 B1 | 12/2002 | Chen et al. | |
| 6,597,067 B1 | 7/2003 | Biery et al. | |
| 6,677,647 B1 | 1/2004 | Dawson | |
| 6,678,951 B2 | 1/2004 | Atakov et al. | |
| 7,016,794 B2 | 3/2006 | Schultz | |
| 7,062,850 B2 | 6/2006 | Atakov et al. | |
| 7,307,344 B2 | 12/2007 | Minamihaba et al. | |
| 7,407,605 B2 | 8/2008 | Restaino et al. | |
| 7,439,173 B2 | 10/2008 | Greco et al. | |
| 7,451,411 B2 | 11/2008 | Hau-Riege et al. | |
| 7,468,320 B2 | 12/2008 | Hu et al. | |
| 7,471,539 B2 | 12/2008 | Oates et al. | |
| 7,727,892 B2 | 6/2010 | Morrow et al. | |
| 8,056,039 B2 | 11/2011 | Chanda et al. | |
| 8,211,776 B2 | 7/2012 | Horak et al. | |

(Continued)

OTHER PUBLICATIONS

U.S. Appl. No. 12/652,485, filed Jan. 5, 2010; Notice of Allowance—Mail Date Feb. 23, 2012; pp. 1-11.

(Continued)

*Primary Examiner* — Hoai V Pham
(74) *Attorney, Agent, or Firm* — Cantor Colburn LLP; Parashos Kalaitzis

(57) ABSTRACT

An integrated circuit comprising an electromigration barrier includes a line, the line comprising a first conductive material, the line further comprising a plurality of line segments separated by one or more electromigration barriers, wherein the one or more electromigration barriers comprise a second conductive material that isolates electromigration effects within individual segments of the line.

19 Claims, 11 Drawing Sheets

(56) References Cited

U.S. PATENT DOCUMENTS

2003/0116439 A1* 6/2003 Seo et al. .................. 205/125
2007/0063352 A1 3/2007 Archer, III et al.
2010/0084767 A1 4/2010 Yang et al.
2010/0219512 A1* 9/2010 Tada et al. .................. 257/632
2012/0104610 A1 5/2012 Filippi et al.

OTHER PUBLICATIONS

V. Sukharev, et al., "A Model for Electromigration-Induced Degradation Mechanisms in Dual-Inlaid Copper Interconnects: Effect of Microstructure;" Journal of Applied Physics 102; 2007; pp. 053505-1-053505-14.

I. A. Blech, "Electromigration in Thin Aluminum Films on Titanium Nitride", J. Appl. Phys., vol. 47, 1976, pp. 1203-1208.

Douglas J. Guerrero, et al.," Anti-reflective coating for multipatterning lithography," Advances in Resist Materials and Processing Technology XXV, edited by Clifford L. Henderson, Proc. of SPIE vol. 6923, 69230X, 2008, pp. 1-7.

L. T. Romankiw, •A path: From Electroplating Through Lithographic Masks in Electronics to LIGA in MEMS, Electrochimica Acta, vol. 42, Nos. 20-22, pp. 2985-3005, 1997.

R.A. Wachnik, et al.,"Practical Benefits of the Electromigration Short-Length Effect, Including a New Design Rule Methodology and an Electromigration Resistant Power Grid with Enhanced Wireability," Symposium on VLSI Technology Digest of Technical Papers, IEEE, pp. 1-2, 2000.

Sukharev, et al; "A Model for Electromigration-Induced Degradation Mechanisms in Dual-Inlaid Copper Interconnects: Effects of Microstructure;" Journal of Applied Physeis 102; 2007; pps. 053505-1—053505-14.

* cited by examiner

INTEGRATED CIRCUIT LINE WITH ELECTROMIGRATION BARRIERS

CROSS REFERENCE TO RELATED APPLICATION

This application is a divisional of U.S. application Ser. No. 12/652,485, filed on Jan. 5, 2010.

BACKGROUND

This disclosure relates generally to the field of integrated circuit fabrication.

Electromigration (EM) is a potential cause of failure in the lines of an integrated circuit. Electromigration failure occurs when electrons traveling through a line drag the conductor material comprising the line; over time, microvoids are formed in the line. Microvoids may collect into a larger void, potentially reducing the conductivity of the line or causing an open circuit if the void crosses the width of the line, causing failure in the integrated circuit.

SUMMARY

An exemplary embodiment of an integrated circuit comprising an electromigration barrier includes a line, the line comprising a first conductive material, the line further comprising a plurality of line segments separated by one or more electromigration barriers, wherein the one or more electromigration barriers comprise a second conductive material that isolates electromigration effects within individual segments of the line.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of systems and methods for an integrated circuit lines with electromigration barriers are provided, with exemplary embodiments being discussed below in detail. Electromigration microvoids may be contained to small segments of a line by electromigration barriers, or line breaks, thereby preventing collection of the microvoids into larger voids that may cause line failure. A sacrificial dielectric material may be removed in stages in the fabrication process to form line segments separated by one or more electromigration barriers. The electromigration barriers may comprise a conductive material such as cobalt-tungsten-phosphorus (CoWP) that acts to contain the effects of electromigration. In some embodiments, a line comprising electromigration barriers may be located in the back end of line (BEOL) portion of the integrated circuit.

Figure 1A:
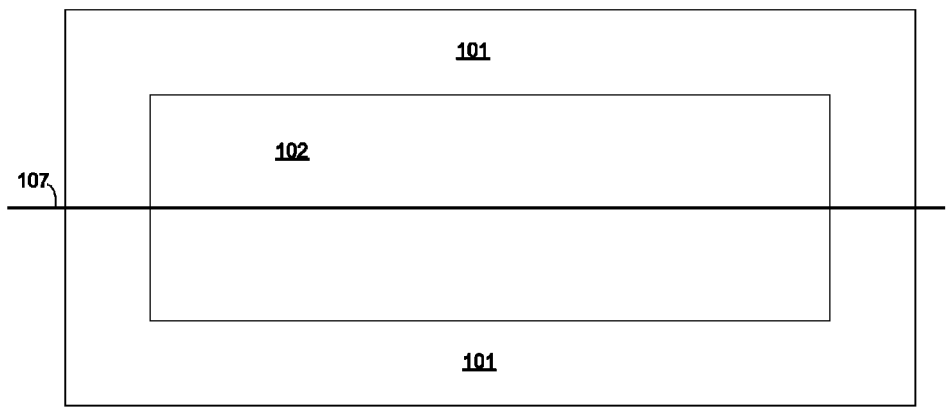
FIGS. 1A and 1B illustrate a top view 100a and a cross section 100b of an embodiment of a process for fabricating an integrated circuit comprising electromigration barriers after patterning the line break mask.
Figure 1B:
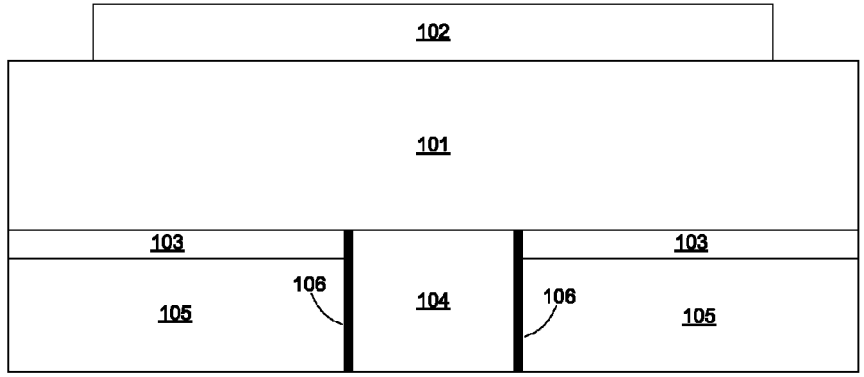

FIGS. 1A and 1B illustrate a top view 100a and a cross section 100b along line 107 of an embodiment of a process for fabricating an integrated circuit comprising electromigration barriers after patterning the line break mask. Resist 102 is patterned on top of a portion of sacrificial dielectric 101 to delineate the line break mask of the integrated circuit. As particularly illustrated in FIG. 1B, the integrated circuit comprises sacrificial dielectric 101, NBLoK (SiCNH) cap 103, copper via 104, inter-layer dielectric (ILD) 105, and via liner 106; the above materials are shown for compatibility purposes only. Sacrificial dielectric 101 may comprise any appropriate dielectric material, such as silicon oxide ($SiO_2$).

Figure 2A:
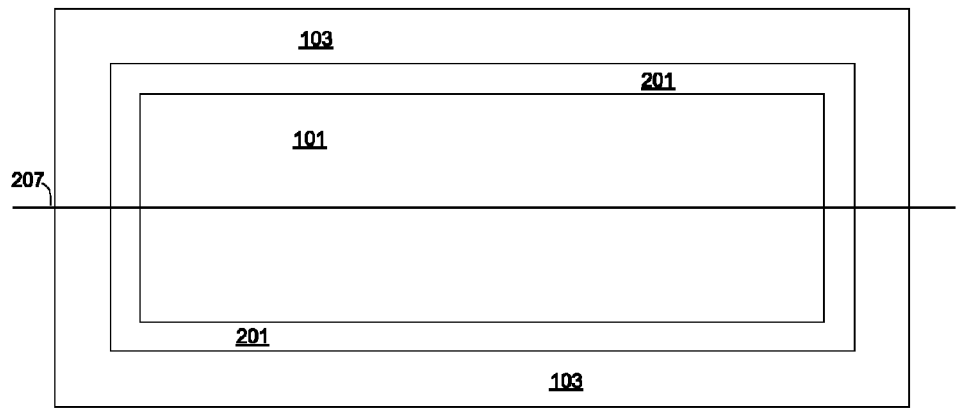
FIGS. 2A and 2B illustrate a top view 200a and a cross section 200b of an embodiment of a process for fabricating an integrated circuit comprising electromigration barriers after etching, removal of the resist, and formation of a spacer.
Figure 2B:
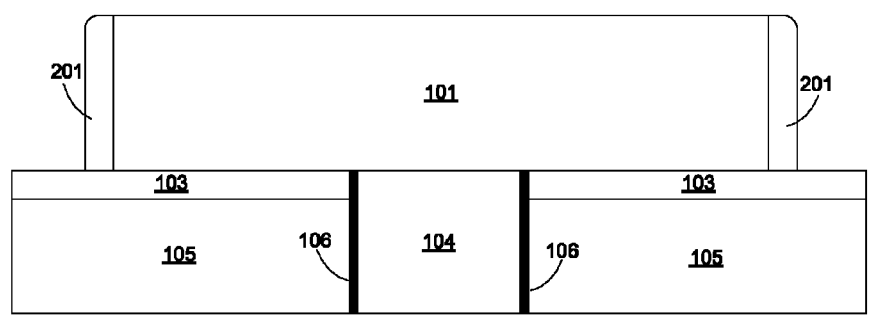

FIGS. 2A and 2B illustrate a top view 200a and a cross section 200b along line 207 of an embodiment of a process for fabricating an integrated circuit comprising electromigration barriers after etching, removal of the resist 102, and formation of a spacer 201. Etching of exposed sacrificial dielectric 101 and removal of resist 102 may be performed by any appropriate method. After removal of resist 102, spacer 201 is formed on sidewalls of the remaining sacrificial dielectric 101 that was not etched off, corresponding to the location of the electromigration barrier(s). Spacer 201 may comprise titanium in some embodiments.

Figure 3A:
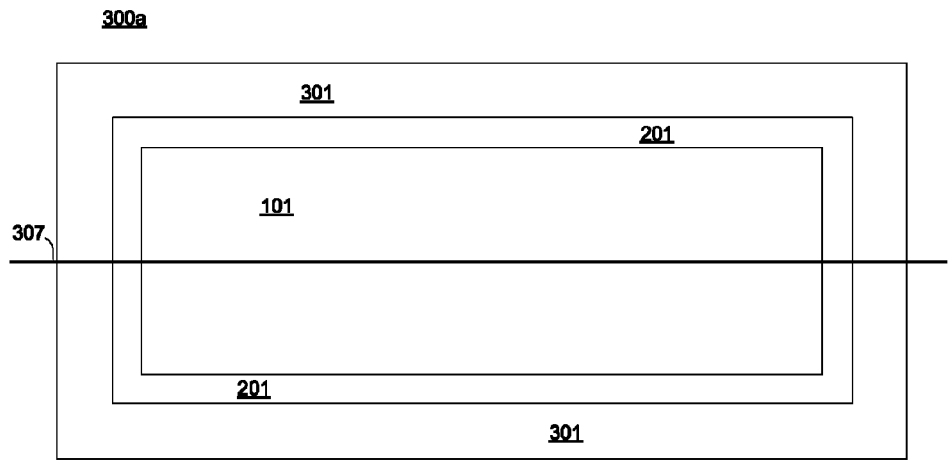
FIGS. 3A and 3B illustrate a top view 300a and a cross section 300b of an embodiment of a process for fabricating an integrated circuit comprising electromigration barriers after filling in with additional dielectric.
Figure 3B:
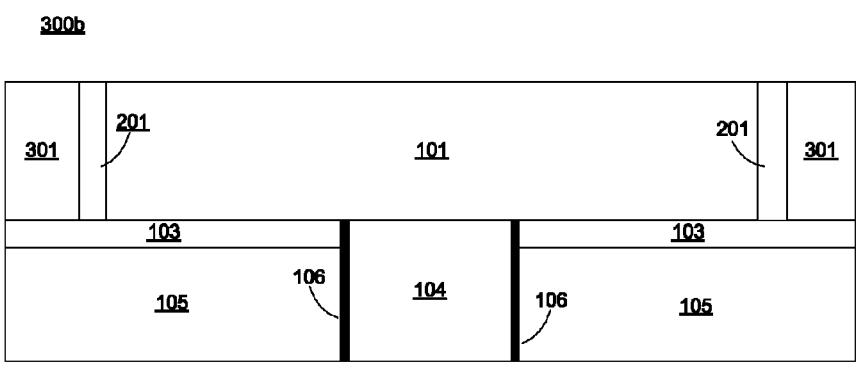

FIGS. 3A and 3B illustrate a top view 300a and a cross section 300b along line 307 of an embodiment of a process for fabricating an integrated circuit comprising electromigration barriers after filling in with additional sacrificial dielectric 301. Additional sacrificial dielectric 301 may comprise any appropriate dielectric material, such as silicon oxide ($SiO_2$). The additional sacrificial dielectric 301 is formed adjacent to spacer 201. The top surface of the integrated circuit (comprising sacrificial dielectric 101, additional sacrificial dielectric 301, and spacer 201) may then be polished.

Figure 4A:
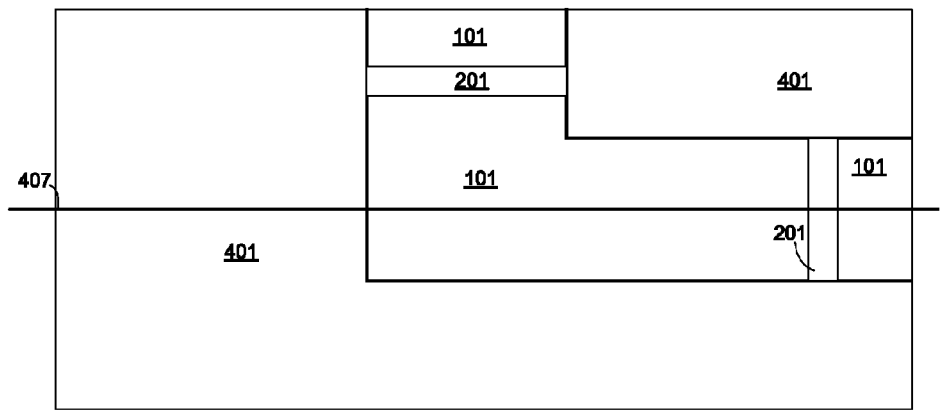
FIGS. 4A and 4B illustrate a top view 400a and a cross section 400b of a process for fabricating an integrated circuit comprising electromigration barriers after patterning the line mask.
Figure 4B:
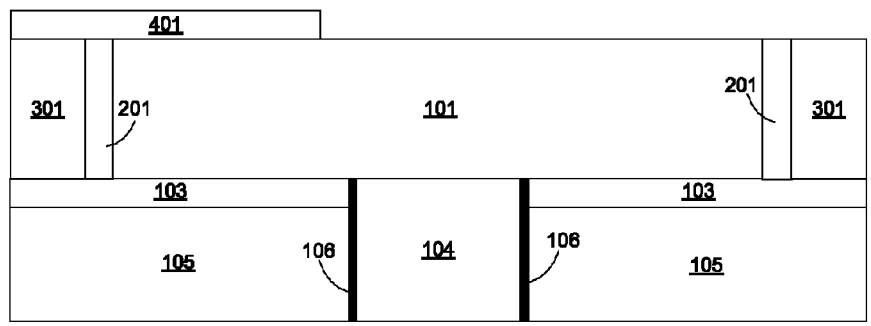

FIGS. 4A and 4B illustrate a top view 400a and a cross section 400b along line 407 of a process for fabricating an integrated circuit comprising electromigration barriers after patterning the line mask. Resist 401 is patterned on top of sacrificial dielectric 101, additional sacrificial dielectric 301, and spacer 201 to delineate the line mask pattern to be applied to the integrated circuit.

Figure 5A:
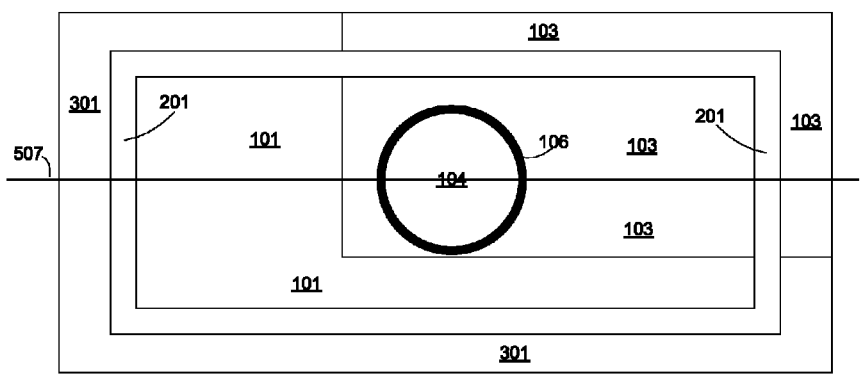
FIGS. 5A and 5B illustrate a top view 500a and a cross section 500b of a process for fabricating an integrated circuit comprising electromigration barriers after etching and removal of the resist.
Figure 5B:
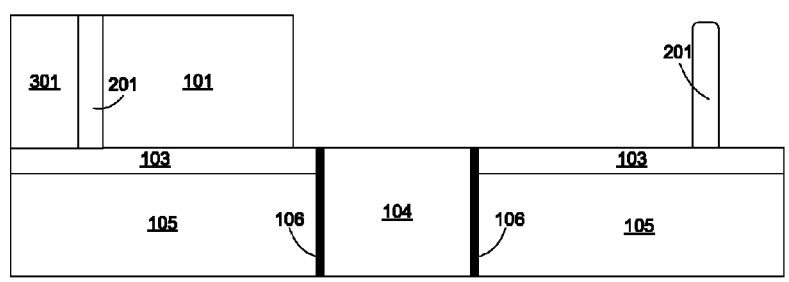

FIGS. 5A and 5B illustrate a top view 500a and a cross section 500b along line 507 of a process for fabricating an integrated circuit comprising electromigration barriers after etching of the line mask pattern into the sacrificial dielectric 101 and additional sacrificial dielectric 301 and removal of resist 401. Etching of the exposed sacrificial dielectric 101 and additional sacrificial dielectric 301, and removal of resist 401, may be performed by any appropriate method that does not affect spacer 201.

Figure 6A:
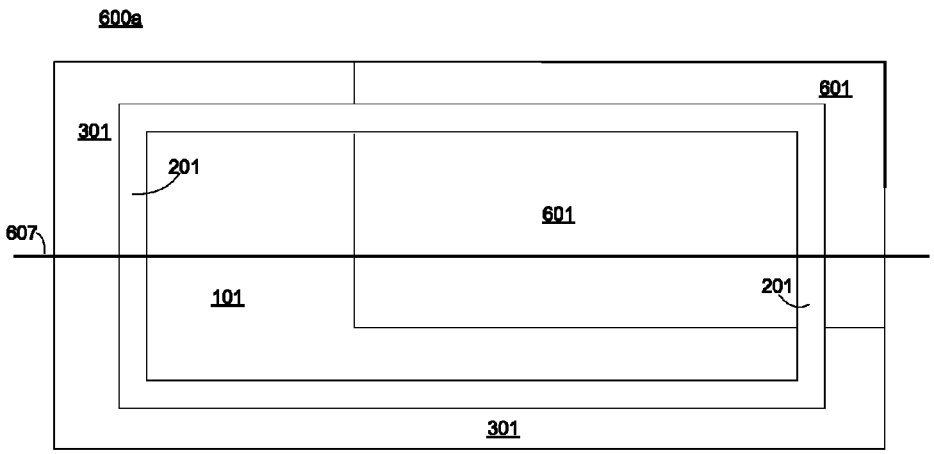
FIGS. 6A and 6B illustrate a top view 600a and a cross section 600b of a process for fabricating an integrated circuit comprising electromigration barriers after formation of a line.
Figure 6B:
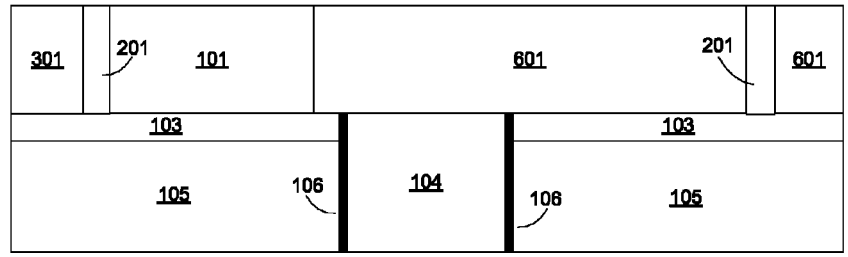

FIGS. 6A and 6B illustrate a top view 600a and a cross section 600b along line 607 of a process for fabricating an integrated circuit comprising electromigration barriers after formation of a line. Line 601 may comprise copper, and may be applied by a damascene process without a liner material in some embodiments. The presence of spacer 201 defines one or more breaks in line 601, which comprises a plurality of segments separated by the one or more breaks.

Figure 7A:
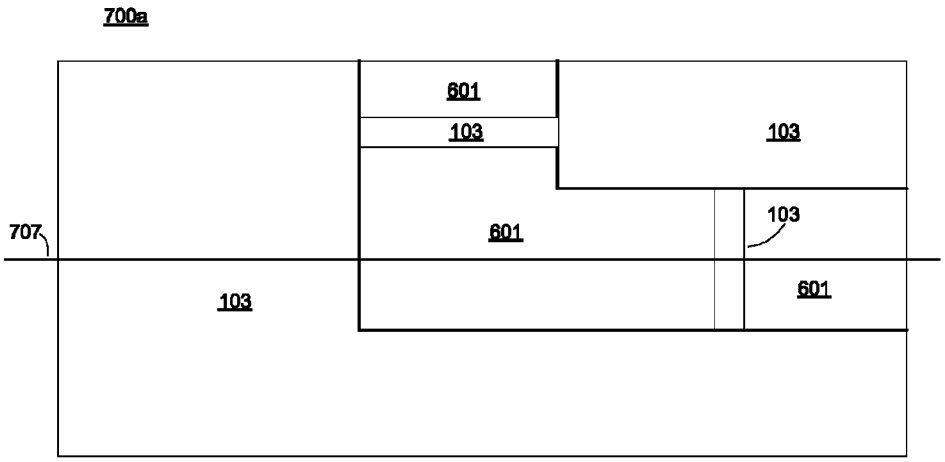
FIGS. 7A and 7B illustrate a top view 700a and a cross section 700b of a process for fabricating an integrated circuit comprising electromigration barriers after wet etching the dielectric and spacer.
Figure 7B:
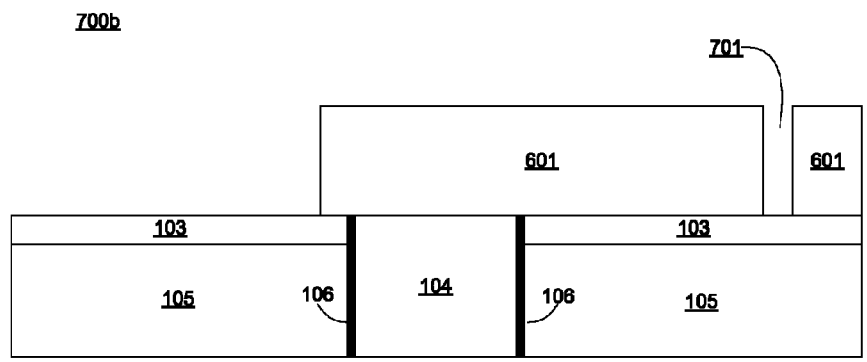

FIGS. 7A and 7B illustrate a top view 700a and a cross section 700b along line 707 of a process for fabricating an integrated circuit comprising electromigration barriers after removing the remaining portions of the sacrificial dielectric 101, additional sacrificial dielectric 301, and spacer 201. For example, removal may comprise wet etching that does not affect the material that comprises line 601. For example, for an $SiO_2$ sacrificial dielectric material and a titanium spacer material, a hydrofluoric acid (HF) wet etch may be utilized. Removal of spacer 201 results in empty line break 701 in line 601.

Figure 8A:
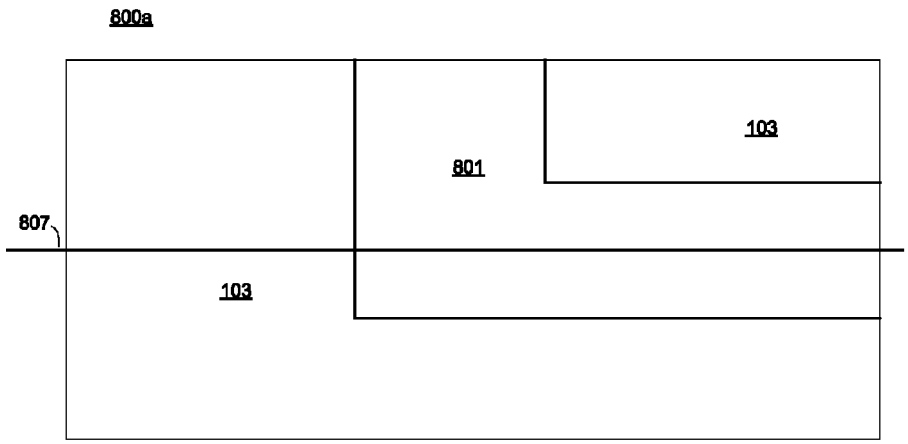
FIGS. 8A and 8B illustrate a top view 800a and a cross section 800b of a process for fabricating an integrated circuit comprising electromigration barriers after formation of a liner.
Figure 8B:
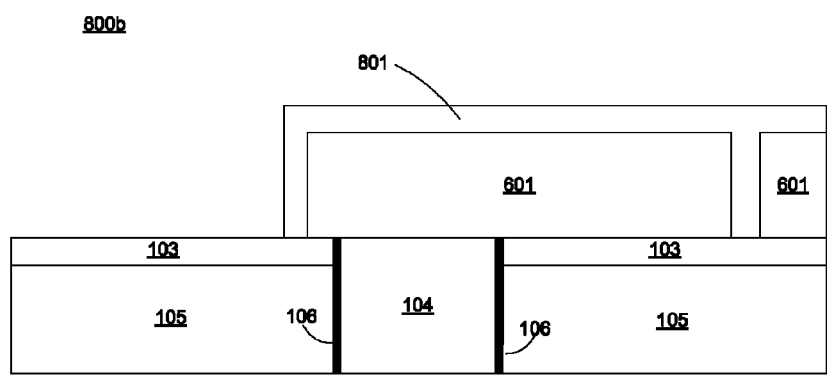

FIGS. 8A and 8B illustrate a top view 800a and a cross section 800b along line 807 of a process for fabricating an integrated circuit comprising electromigration barriers after formation of a liner 801. Liner 801 comprises a conductive material that acts to contain the effects of electromigration in line 601 by disallowing microvoids caused by electromigration from traveling between segments of line 601 and coalescing into a larger void; this prevents formation of larger voids that may decrease the conductivity of line 601. Liner 801 may comprise CoWP in some embodiments. Liner 801 is formed over line 601, and fills in empty line break 701.

Figure 9A:
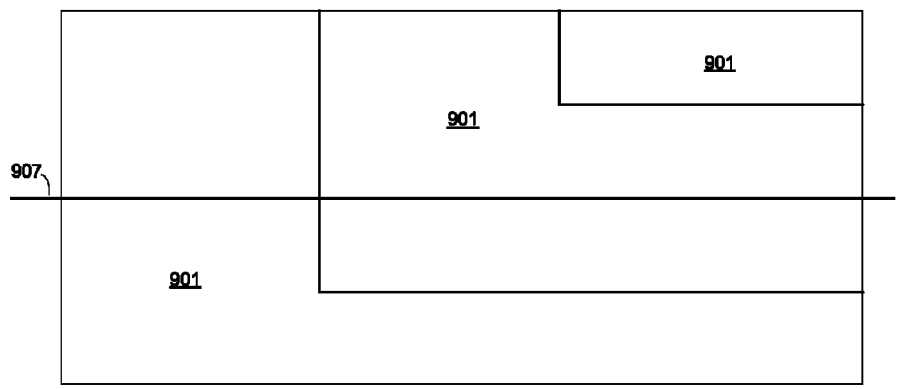
FIGS. 9A and 9B illustrate a top view 900a and a cross section 900b of a process for fabricating an integrated circuit comprising electromigration barriers after formation of a dielectric liner.
Figure 9B:
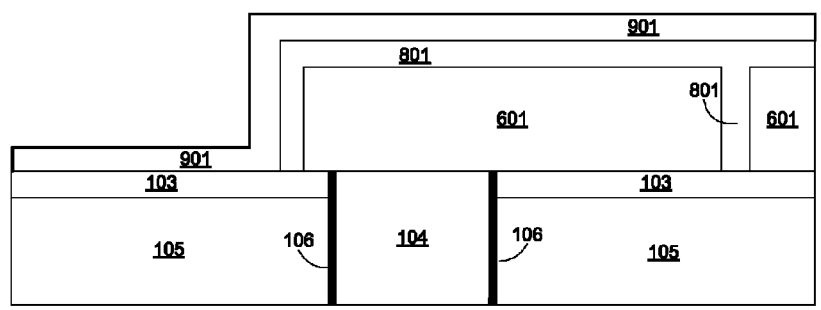

FIGS. 9A and 9B illustrate a top view 900a and a cross section 900b along line 907 of a process for fabricating an integrated circuit comprising electromigration barriers after formation of dielectric liner 901. Dielectric liner 901 may comprise an NBLoK cap layer. The dielectric liner 901 is formed over liner 801 and exposed NBLoK 103.

Figure 10A:
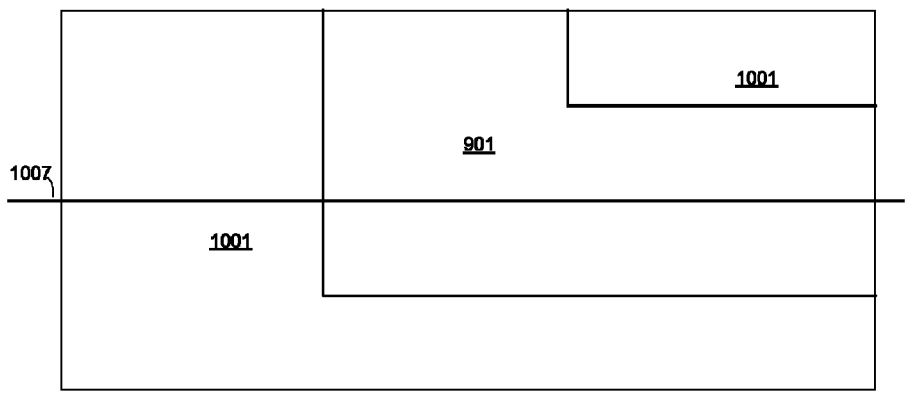
FIGS. 10A and 10B illustrate a top view 1000a and a cross section 1000b of a process for fabricating an integrated circuit comprising electromigration barriers after formation of an inter-layer dielectric (ILD) layer.
Figure 10B:
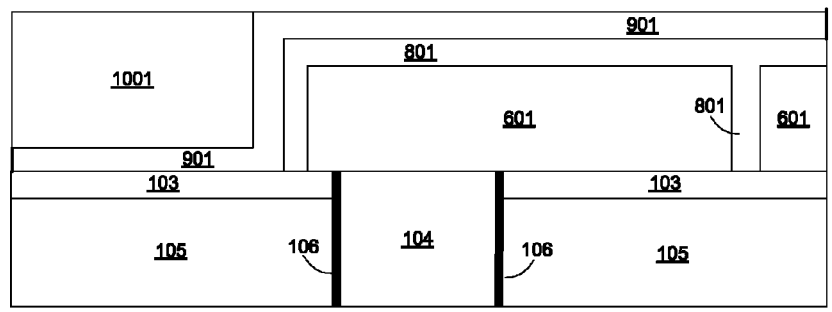

FIGS. 10A and 10B illustrate a top view 1000a and a cross section 1000b along line 1007 of a process for fabricating an integrated circuit comprising electromigration barriers after formation of final ILD layer 1001. Final ILD layer 1001 is formed over dielectric liner 901. The resulting integrated circuit comprises a segmented line 601 having line breaks filled in with liner 801. The filled-in line breaks, or electromigration barriers, contain microvoids formed by electromigration to the individual segments of segmented line 601, preventing grouping of microvoids into a larger void that may reduce the conductivity or cause open circuits in line 601. Line 601 may comprise any appropriate number of line segments separated by electromigration barriers, based on the size of line 601.

Figure 11:
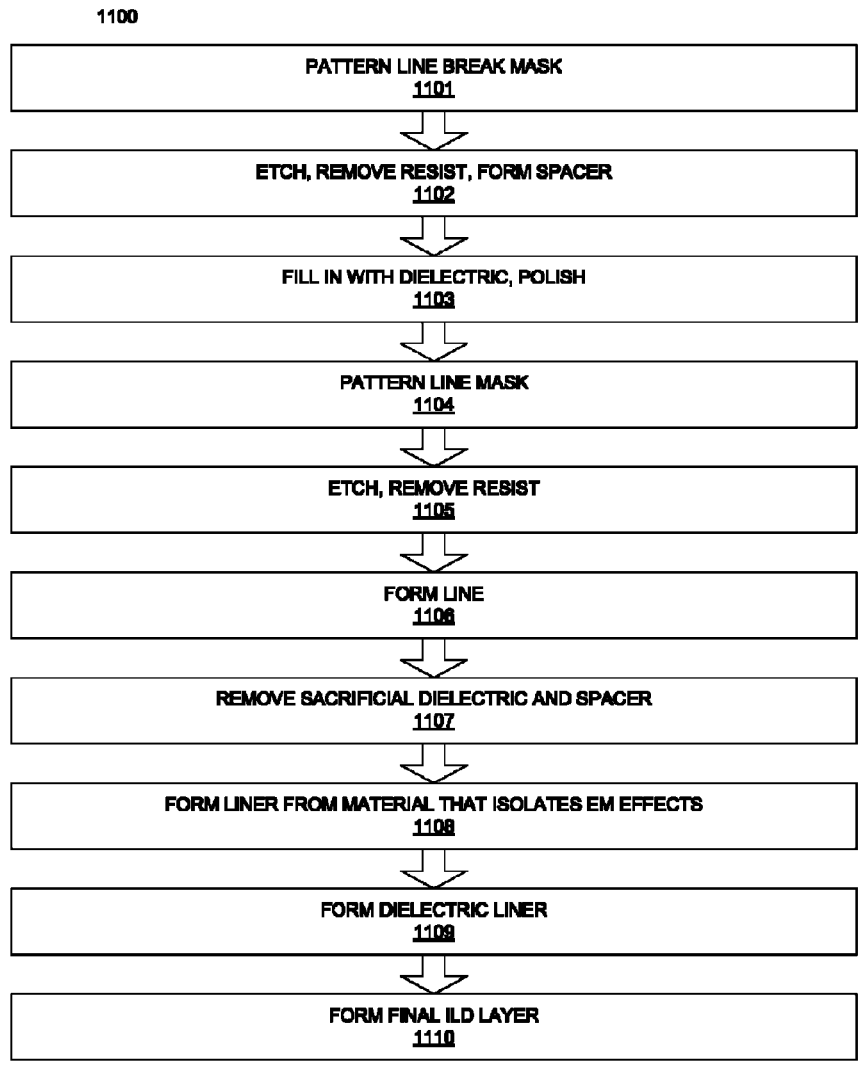
FIG. 11 illustrates an embodiment of a method 1100 for fabricating an integrated circuit comprising electromigration barriers.

FIG. 11 is a flow diagram illustrating an embodiment of a method 1100 for fabricating an integrated circuit comprising electromigration barriers. In block 1101, a line break mask is patterned on the integrated circuit by application of resist to a dielectric surface, as is shown in FIG. 1. In block 1102, the exposed dielectric is etched, the resist is removed, and a spacer is formed adjacent the remaining dielectric, as is shown in FIG. 2. The spacer may comprise titanium in some embodiments. In block 1103, the integrated circuit is filled in with additional sacrificial dielectric, and the surface is polished, as is shown in FIG. 3. In block 1104, resist is applied to pattern the line mask, as is shown in FIG. 4. In block 1105, the exposed dielectric is etched, and the resist is removed, as is shown in FIG. 5. In block 1106, a line comprising a break is formed adjacent to the spacer, as is shown in FIG. 6. The line may comprise a copper line formed by a damascene process in some embodiments. In block 1107, the remaining sacrificial dielectric and the spacer are removed to form an empty break in the line, as is shown in FIG. 7. Hydroflouric wet etching or any other appropriate removal method may be used to remove the sacrificial dielectric and the spacer in some embodiments. In block 1108, a liner is formed in the empty break and over the line from a conductive material that isolates electromigration effects within individual segments of the line, as is shown in FIG. 8. The liner may comprise CoWP in some embodiments. In block 1109, a dielectric liner is formed over the liner, as is shown in FIG. 9. In block 1110, a final ILD layer is formed, resulting in an integrated circuit comprising electromigration barriers, as is shown in FIG. 10.

The technical effects and benefits of exemplary embodiments include prevention of electromigration failure in an integrated circuit.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. An integrated circuit comprising an electromigration barrier, comprising:

a line, the line comprising a first conductive material, the line further comprising a plurality of line segments separated by one or more electromigration barriers, wherein the one or more electromigration barriers comprise a second conductive material that isolates electromigration effects within individual segments of the line, and wherein the line is located within a single wiring layer in a back end of line (BEOL) portion of the integrated circuit.

2. The integrated circuit of claim 1, wherein the second conductive material comprises a cobalt-tungsten-phosphorus compound.

3. The integrated circuit of claim 1, wherein the first conductive material comprises copper formed by a damascene process.

4. The integrated circuit of claim 1, further comprising a layer comprising the second conductive material formed over the line.

5. The integrated circuit of claim 4, further comprising a first dielectric liner formed over the layer comprising the second conductive material.

6. The integrated circuit of claim 5, further comprising a first inter-layer dielectric layer formed over the dielectric liner.

7. The integrated circuit of claim 1, wherein the line contacts a via of the integrated circuit.

8. The integrated circuit of claim 7, wherein the first conductive material of the line contacts the via of the integrated circuit.

9. The integrated circuit of claim 7, wherein the via extends through a second inter-layer dielectric layer of the integrated circuit.

10. The integrated circuit of claim 9, wherein the via additionally extends through a second dielectric liner that is located between the second inter-layer dielectric layer and the line.

11. The integrated circuit of claim 10, wherein each of the plurality of line segments of the line that comprise the first conductive material are located directly on the second dielectric liner.

12. The integrated circuit of claim 10, wherein the one or more electromigration barriers comprising the second conductive material are located directly on the second dielectric liner.

13. The integrated circuit of claim 7, wherein the via comprises a copper via.

14. An integrated circuit comprising an electromigration barrier, comprising:
   a line, the line comprising a first conductive material, the line further comprising a plurality of line segments separated by one or more electromigration barriers, wherein the one or more electromigration barriers comprise a second conductive material that isolates electromigration effects within individual segments of the line; and
   wherein the line contacts a via of the integrated circuit, wherein the via extends through a dielectric layer, and wherein each of the plurality of line segments of the line are located directly on the dielectric layer through which the via extends.

15. The integrated circuit of claim 14, wherein the dielectric layer through which the via extends comprises an inter-layer dielectric layer located underneath a first dielectric liner, and wherein the plurality of line segments of the line are located directly on the first dielectric liner.

16. The integrated circuit of claim 14, wherein the one or more electromigration barriers are located directly on the dielectric layer through which the via extends.

17. The integrated circuit of claim 14, further comprising a layer comprising the second conductive material formed over the line.

18. The integrated circuit of claim 14, further comprising a dielectric liner formed over the layer comprising the second conductive material.

19. The integrated circuit of claim 18, further comprising a second inter-layer dielectric layer located over the dielectric liner, wherein the inter-layer dielectric layer is not in direct contact with the layer comprising the second conductive material.

\* \* \* \* \*